United States Patent [19]

Shimizu et al.

[11] Patent Number: 5,025,472

[45] Date of Patent: Jun. 18, 1991

[54] REVERBERATION IMPARTING DEVICE

[75] Inventors: Yasushi Shimizu; Fukushi Kawakami, both of Hamamatsu, Japan

[73] Assignee: Yamaha Corporation, Hamamatsu, Japan

[21] Appl. No.: 198,473

[22] Filed: May 25, 1988

[30] Foreign Application Priority Data

May 27, 1987 [JP] Japan ............................... 62-130343

[51] Int. Cl.[5] ............................................... H03G 3/00

[52] U.S. Cl. ........................................ 381/63; 381/83; 84/DIG. 26

[58] Field of Search ........................ 381/63, 71, 83, 93; 84/630, 662, DIG. 26

[56] References Cited

U.S. PATENT DOCUMENTS

| | | | |
|---|---|---|---|
| 3,535,453 | 10/1970 | Veneklasen | 381/64 |
| 4,066,842 | 1/1978 | Allen | 381/66 |
| 4,578,543 | 3/1986 | Le Bourlot et al. | 379/410 |
| 4,609,787 | 9/1986 | Horna | 379/410 |
| 4,706,291 | 11/1987 | Kakubo et al. | 381/63 |

*Primary Examiner*—Forester W. Isen

*Attorney, Agent, or Firm*—Spensley Horn Jubas & Lubitz

[57] ABSTRACT

A reverberation imparting device for electro-acoustically enhancing reverberation in acoustic space comprises a microphone disposed in the acoustic space, a loudspeaker disposed in the acoustic space for diffusing the sound picked up by the microphone, and feedback means comprising a signal processing circuit for electrically processing an electric signal corresponding to the sound picked up by the microphone, an output of the signal processing circuit being supplied to the loudspeaker. The microphone, feedback means and loudspeaker form a feedback loop. The signal processing circuit comprises a circuit for subjecting impulse responses of finite length to a convolution operation. Time axis of reflected sounds is extended and extension of reverberation time thereby is realized without depending upon loop gain. Density of reflected sounds is increased by subjecting impulse responses of finite length to a convolution operation whereby separation of reflected sounds is prevented.

11 Claims, 7 Drawing Sheets

REVERBERATION IMPARTING DEVICE

BACKGROUND OF THE INVENTION

This invention relates to a device for electro-acoustically enhancing reverberation in acoustic space and, more particularly, to a device of this type capable of extending reverberation time by a large extent while preventing occurrence of howling.

Recent diversification of purposes or uses of public facilities such as a concert hall, multi-purpose hall, an event hall and multi-purpose gymnasium has brought about complication of architectural condition in designing these public facilities which has necessitated utilization of electro-acoustic systems therein. Particularly, it is desired in acoustic design to cope with architectural conditions such as those in a hall of a special shape (e.g., amphitheatre), large-scale event hall (e.g., multi-purpose gymnasium) and multi-purpose hall (e.g., banquet hall) for which conventional architectural acoustics technique cannot provide an optimum design and, for this purpose, it has become necessary to utilize electro-acoustic means even with respect to conditions which have heretofore been controlled by architectural acoustic means.

A sound field control method utilizing an electro-acoustic system not only is capable of varying acoustic conditions to a large extent without being bound by architectural restrictions but also is superior to architectural adjusting such as adjusting by using sound absorbing material in controllability, operability and economic aspect and hence practical application of the sound field control method utilizing electro-acoustic system is greatly anticipated.

In a prior art electro-acoustic system, extension of reverberation time has generally been achieved by reinforcing reverberation sound corresponding to reduction of equivalent sound absorption area. More specifically, reinforcing of energy density E is achieved by using relationship $$RT_{60} = K \cdot E_0 \cdot V \quad (1)$$

$$E_0 = \frac{4W}{C \cdot A} P$$

where $RT_{60}$ : reverberation time

K: proportional constant $E_0$ *l: diffused sound energy density*

V: capacity of the room

W: sound source output power

C: sound velocity

A: equivalent sound absorption area

This prior art system is realized by providing, as shown in FIG. 2, a sound collecting microphone 12 and a loudspeaker 14 in an acoustic space 10, reinforcing by an amplifier 16 direct sound and reflected sound from a sound source which have been picked up by the microphone 12 and sounding the reinforced sound from the loudspeaker 14. A feedback loop is formed in this system by picking up sound from the loudspeaker 14 again by the microphone 12 and radiating this sound from the loudspeaker 14 after amplification by the amplifier 16. Thus, reverberation time $RT_{60}$ is extended by reinforcing energy density $E_0$ by reducing equivalent sound absorption area A.

According to this system, reverberation time $RT_{60}$ is extended, as shown in FIG. 3, by increasing loop gain by the amplifier 16. The frequency characteristics of the loop, however, have sharp peak portions as shown in FIG. 4 due to a comb filter effect formed by the feedback loop and these peak portions growing in the frequency characteristics tend to produce howling. For this reason, increase in the loop gain is restricted and the maximum value $RT_{60}$ of reverberation time is limited to:

$$RT_{max} = K \cdot g \cdot E_0 \cdot V$$

where g represents maximum sound reinforcement gain (e.g., value which is 9 dB below the gain at which howling is generated). Besides, in this system, coloration is produced due to the comb filter effect formed by the feedback loop resulting in occurrence of unnaturalness in the reverberation effect.

Accordingly, the reverberation time extension control utilizing loop gain has limitation in the range of extension of reverberation time due to the instability of the feedback loop and coloration in tone quality.

There are AR (Assisted Resonance) system and MCR (Multi-channel Amplification of Reverberation) system as improved systems of the above described system which are intended to extend reverberation time while ensuring stability of the feedback loop.

In the AR system, a multiplicity of band-limited channels A through N are provided in the acoustic space for ensuring stability of the feedback loop and the level of diffused sound is reinforced by amplifying diffused sound in the acoustic space for each frequency band thereby to extend reverberation time. The construction of this system is schematically shown in FIG. 5. In each of the channels A through N, diffused sound picked up by a microphone 18 is supplied through a preamplifier 20 to a filter 22 for band-limitation and the output of the filter 22 is supplied to a loudspeaker 26 through a power amplifier 24. A feedback loop is formed in such a manner that sounds from the loudspeakers 26 in the respective channels are combined together and the combined sound is picked up again by the microphone 18 of each channel. Since it suffices in this system to reduce loop gain only in a frequency band in which howling is generated, this system is capable of increasing the entire diffused sound energy density $E_0$ in comparison with the system of FIG. 2 in which loop gain of the entire bands is reduced so that reverberation time can be extended by a larger extent.

In the MCR system, a multiplicity of independent channels A through N including all frequency bands are provided and extension of reverberation time is achieved by reinforcing diffused sound level in the sound system as in the AR system while flattening transmission frequency characteristics in the feedback loop of each channel. The construction of this system is schematically shown in FIG. 6. In each of the channels A through N, diffused sound picked up by a microphone 28 is supplied to a graphic equalizer 32 through a preamplifier 30 and the output of the graphic equalizer 32 is suplied to a loudspeaker 36 through a power amplifier 34. A feedback loop is formed in each channel in such a manner that sound from the respective loudspeakers 36 in the channels A through N are combined and the combined sound is picked up again by the microphone 28 of each channel. In each of the channels A through N, the graphic equalizer 32 reduces peak gain in a frequency band portion in which howling tends to be generated (this band portion differs one channel from another due to difference in positions of the components of the system).

According to this system, peak frequencies produced due to the comb filter effect are dispersed by using a multiplicity of channels so that total frequency characteristics are made substantially flat. As a result, diffusion sound energy density $E_0$ in the frequency bands as a whole increases and reverberation time can be extended by a larger extent.

The AR system and the MCR system are both constructed on the basic concept of performing reinforcement of reverberation sound corresponding to reduction in equivalent sound absorption area in the acoustic space while subtly maintaining stability of acoustical feedback. In the respective systems, energy addition of amplified gain due to multiple channels is achieved while maintaining stability of a feedback loop by constructing independent channels in the frequency region in the AR system and in time region in the MCR system.

In the AR system and MCR system also, extension of reverberation time is made by increasing loop gain as in the system of FIG. 2. A large number of channels (e.g., several tens or more) are required for achieving extension of reverberation time by a larger extent while maintaining stability of the feedback loop and this incurs increased cost and requires increased time and trouble in adjusting the large number of channels.

SUMMARY OF THE INVENTION

It is, therefore, an object of the invention to provide a reverberation imparting device capable of achieving extension of reverberation time without depending upon loop gain.

The reverberation imparting device achieving the above described object of the invention comprises a microphone disposed in an acoustic space for picking up sound in the acoustic space, loudspeaker means disposed in the acoustic space for diffusing the sound picked up by the microphone, and feedback means comprising a signal processing circuit for electrically processing an electric signal corresponding to the sound picked up by the microphone, an output of the signal processing circuit being supplied to the loudspeaker means, the microphone, feedback means and loudspeaker means forming a feedback loop, and the signal processing circuit in the feedback means comprising means for subjecting impulse responses of finite length to a convolution operation.

In the reverberation time extension control in the prior art systems depending upon loop gain, diffusion sound energy density $E_0$ is increased by reducing equivalent sound absorption area A of the above described formula (1) whereas in the reverberation time extension control according to the invention, room capacity V is substantially enlarged by extending time axis of reflected sounds as shown in FIG. 7 through electrical delay means interposed in the feedback loop.

In the system according to the invention in which time axis of reflected sounds is extended by electrical delay means, extension of reverberation time can be realized without depending upon loop gain so that no cause for howling exists in this system and extension of reverberation time by a larger extent than in the systems utilizing loop gain can be realized.

In the system utilizing extension of time axis, however, density of reflected sounds decreases as the extent of extension of time axis of the reflected sounds increases and, as a result, unnaturalness in reverberation sound due to separation of reflected sounds becomes conspicuous.

According to the invention, density of reflected sounds is increased by subjecting impulse responses of finite length to a convolution operation (i.e., implementing extension of time axis of reflected sound by electrical delay with respect to different delay times in parallel and synthesizing reflected sounds obtained thereby and outputting the synthesized sound) whereby separation of reflected sounds is not caused even if reverberation time is extended to a large extent and a natural reverberation effect thereby can be obtained.

Further, by subjecting such impulse responses of finite length to a convolution operation, a plurality of comb filters having different characteristics are formed in the feedback loop so that frequency characteristics are made flat and coloration thereby is eliminated. This contributes to generation of a more natural reverberation effect.

Embodiments of the reverberation imparting device according to the invention will now be described with reference to the accompanying drawings.

BRIEF DESCRIPTION OF THE DRAWINGS

In the accompanying drawings.

DESCRIPTION OF PREFERRED EMBODIMENTS

Figure 1:
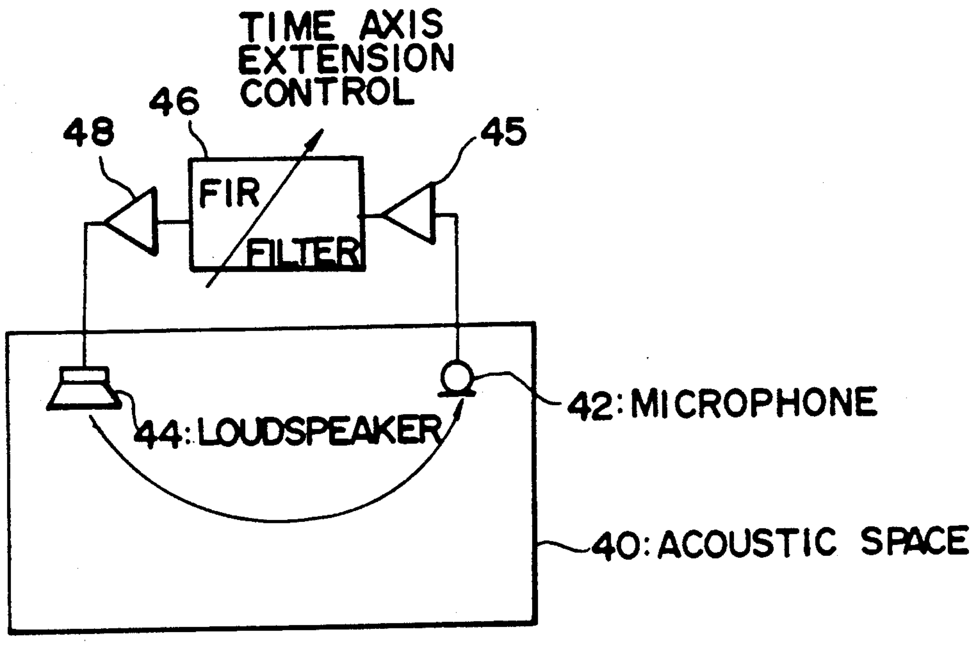
FIG. 1 is a block diagram showing an embodiment of the invention.

An embodiment of the invention is shown in FIG. 1. In an acoustic space 40, there are provided a sound collecting microphone 42 and a loudspeaker 44. Sound picked up by the microphone 42 is applied to an FIR (finite impulse response) filter circuit 46 through a preamplifier 45. The FIR filter circuit 46 produces a plurality of reflected sound signals from a single applied sound by subjecting impulse responses of finite length to a convolution operation. The reflected sound signals produced by the FIR filter circuit 46 are supplied to the loudspeaker 44 through a power amplifier 48 and sounded from the loudspeaker 44. The radiated sound from the loudspeaker 44 is picked up again by the microphone 42 and a feedback loop thereby is formed.

Figure 8:
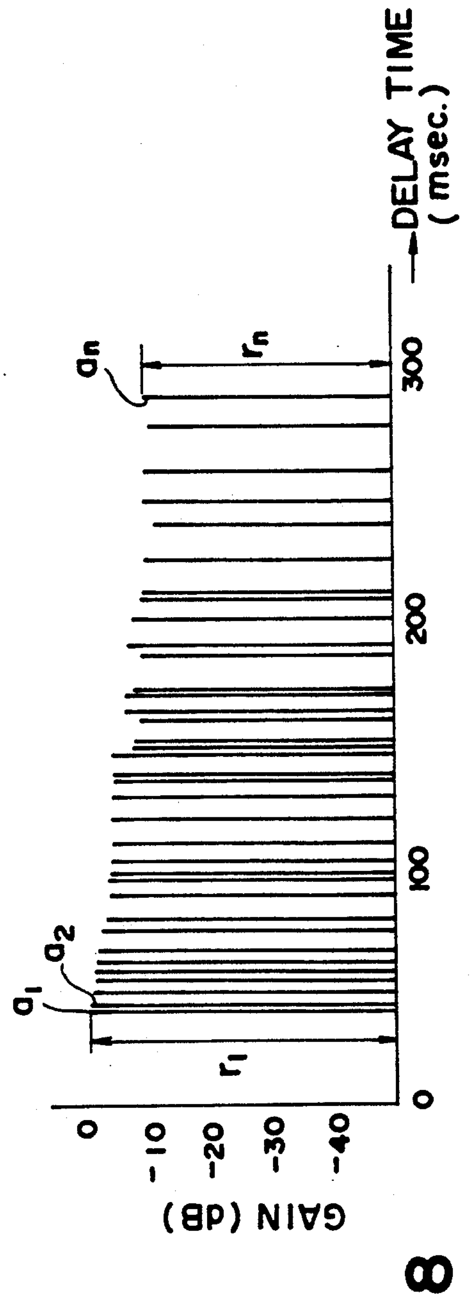
FIG. 8 is a a diagram showing an example of impulse responses stored in the FIR filter circuit 46 in FIG. 1.
Figure 9:
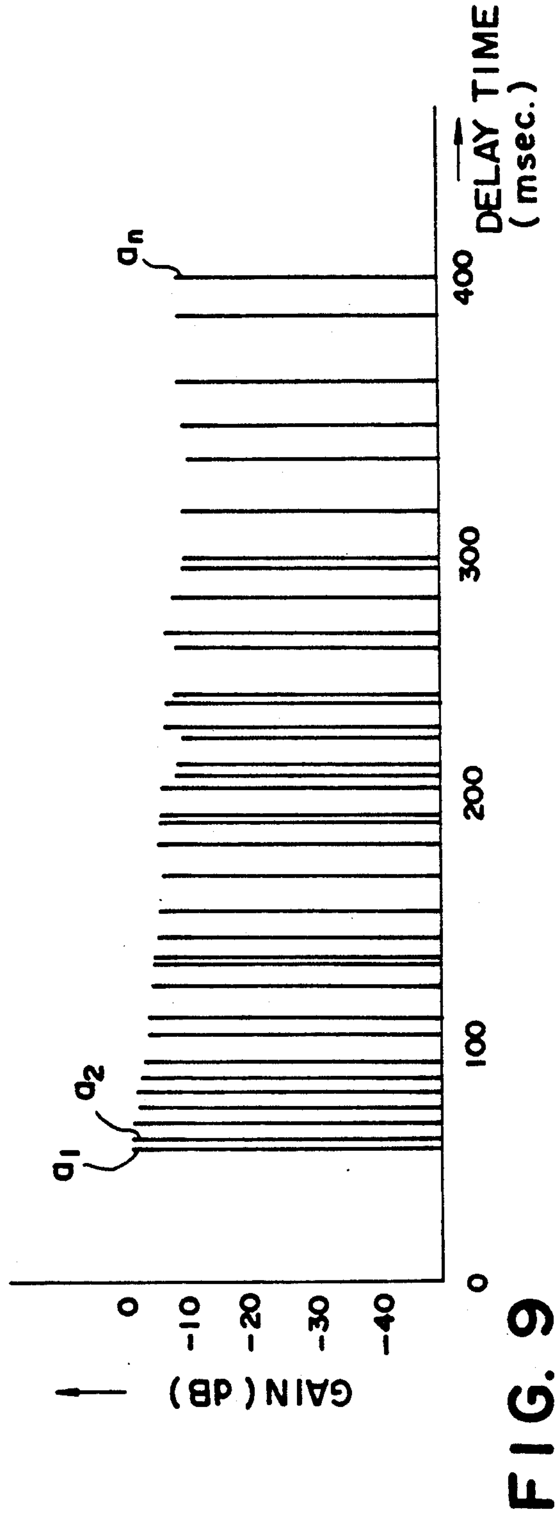
FIG. 9 is a diagram showing a state in which the impulse responses of FIG. 8 are extended on time axis.

The FIR filter circuit 46 stores impulse responses a1, a2, . . . , an as shown, for example, in FIG. 8. An entire collection of impulse responses, such as A1 to An, shall be referred to herein as a composite impulse response. The convolution operation for the input signal is performed by using these impulse responses. More specifically, an input signal which has been delayed by delay times of impulse responses a1, a2, . . . , an is multiplied with coefficients corresponding to gains γ1, γ2, . . . , γn of the impulse responses a1, a2, . . . , an and results of the multiplication are added together and provided as an output. The impulse responses a1, a2, . . . , an stored in the FIR filter 46 can be extended on their time axis as a whole. An example of extended impulse responses is shown in FIG. 9. By extending time axis of the impulse responses, delay time of the feedback loop is extended and this is equivalent to increase in the room capacity so that reverberation time is extended. If individual gains of the respective impulse responses a1, a2, . . . , an are represented by γ1, γ2, . . . , γn, total gain γA of the FIR filter 46 is represented by the following formula:

$$\gamma A = \sqrt{\sum_{m=1}^{n} \gamma m^2}$$

The total gain γA therefore becomes independent of time. Accordingly, extension of time axis of impulse responses does not affect loop gain so that the extension of reverberation time according to this system does not cause howling. Extension of reverberation time by a large extent therefore can be realized.

Besides, since plural impulse responses a1, a2, . . . , an are used, density of reflected sounds increases so that the extension of time axis of impulse responses by a large extent does not bring about unnaturalness in the reverberation effect which would otherwise be caused due to separation of reflected sounds.

Figure 2:
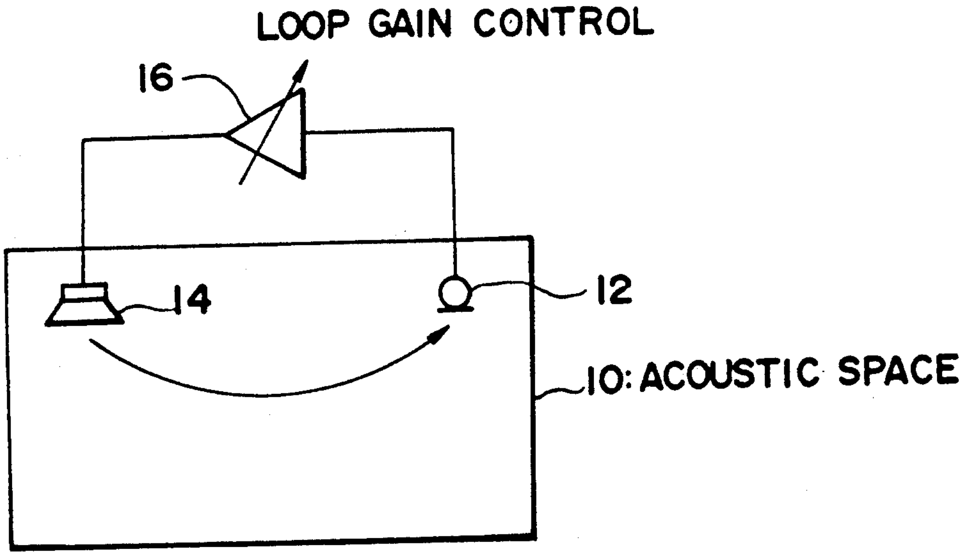
FIG. 2 PRIOR ART
FIG. 2 is a block diagram showing a prior art device.
Figure 3:
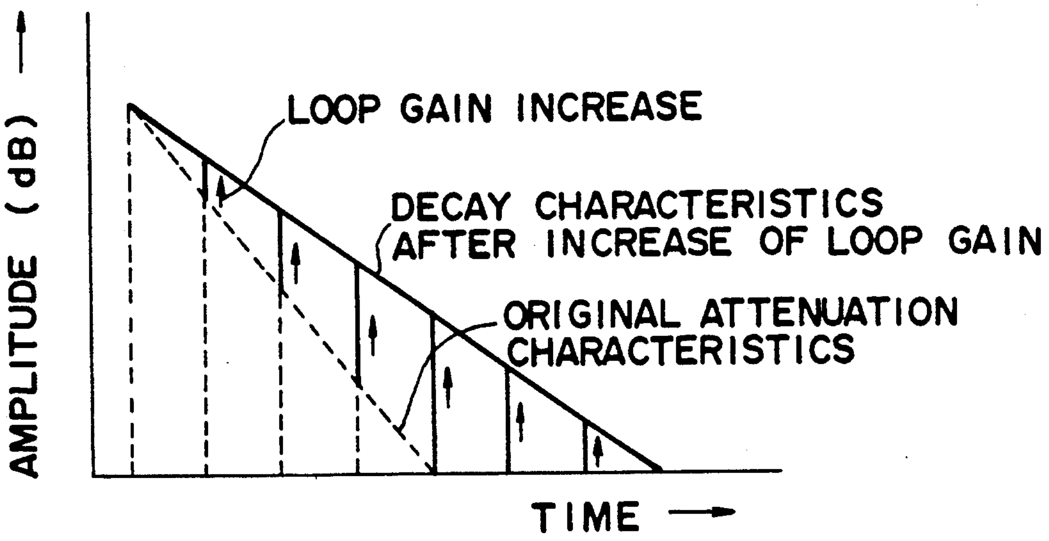
FIG. 3 is a diagram showing attenuation characteristics of reverberation sound in the prior art device of FIG. 2.
Figure 4:
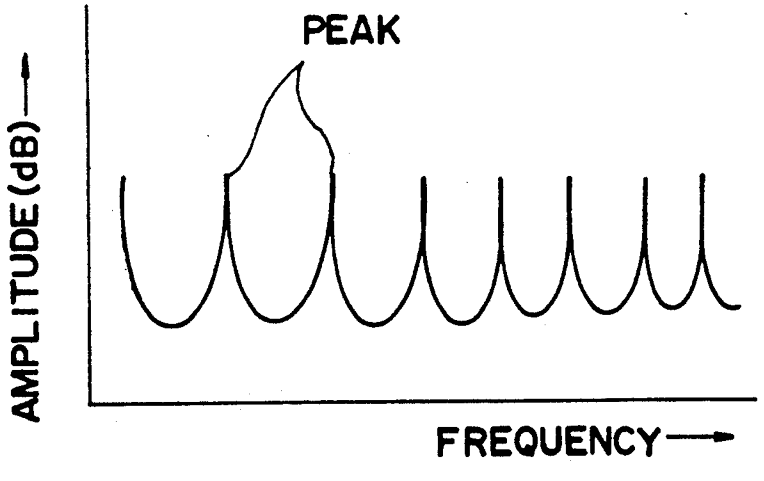
FIG. 4 is a diagram showing frequency characteristics of the device of FIG. 2.
Figure 5:
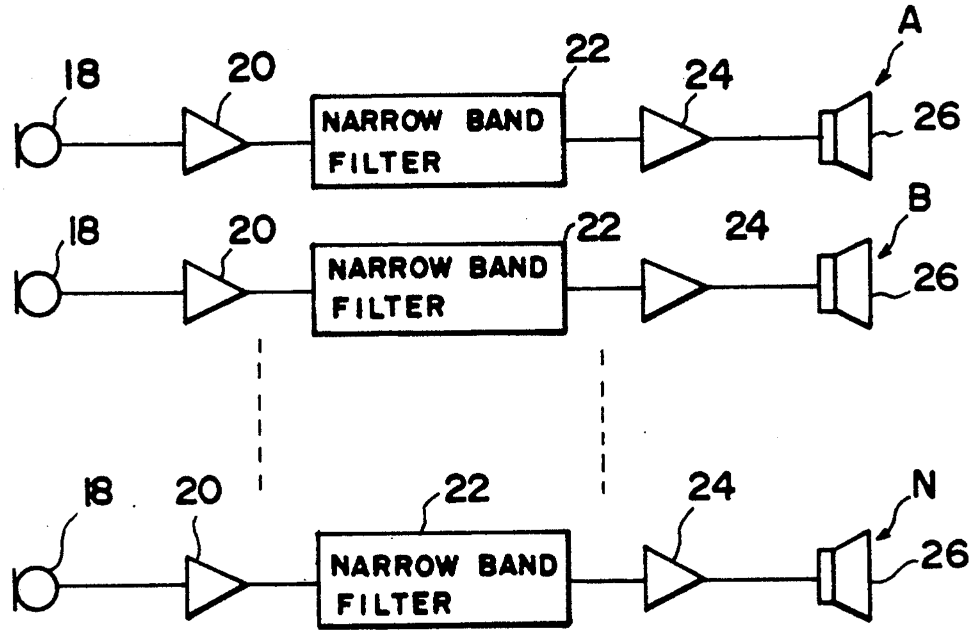
FIG. 5 PRIOR ART
FIG. 5 is a block diagram schematically showing the prior art AR system.
Figure 6:
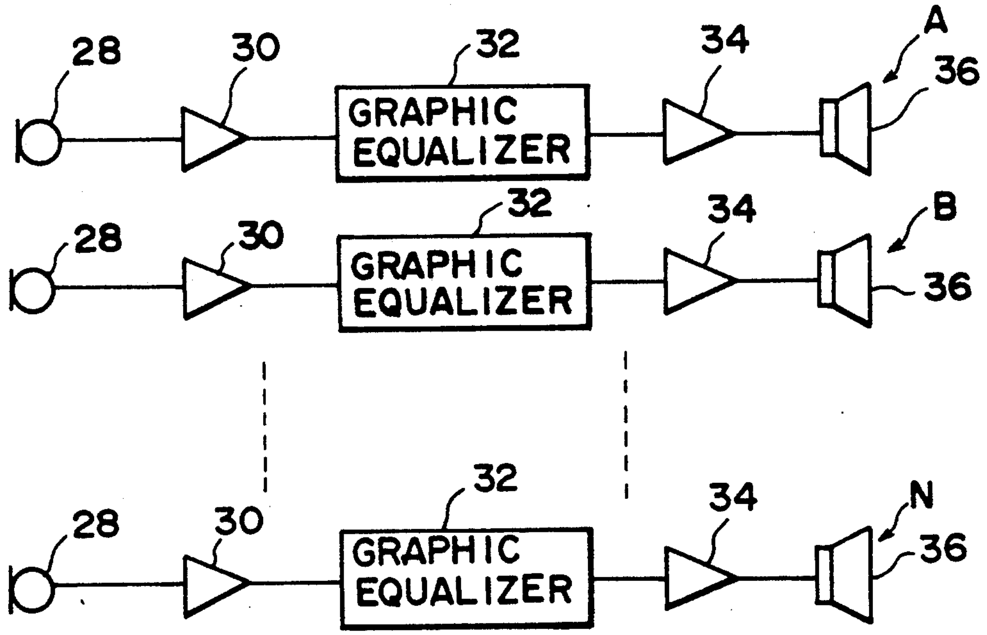
FIG. 6 PRIOR ART
FIG. 6 is a block diagram schematically showing the prior art MCR system.
Figure 7:
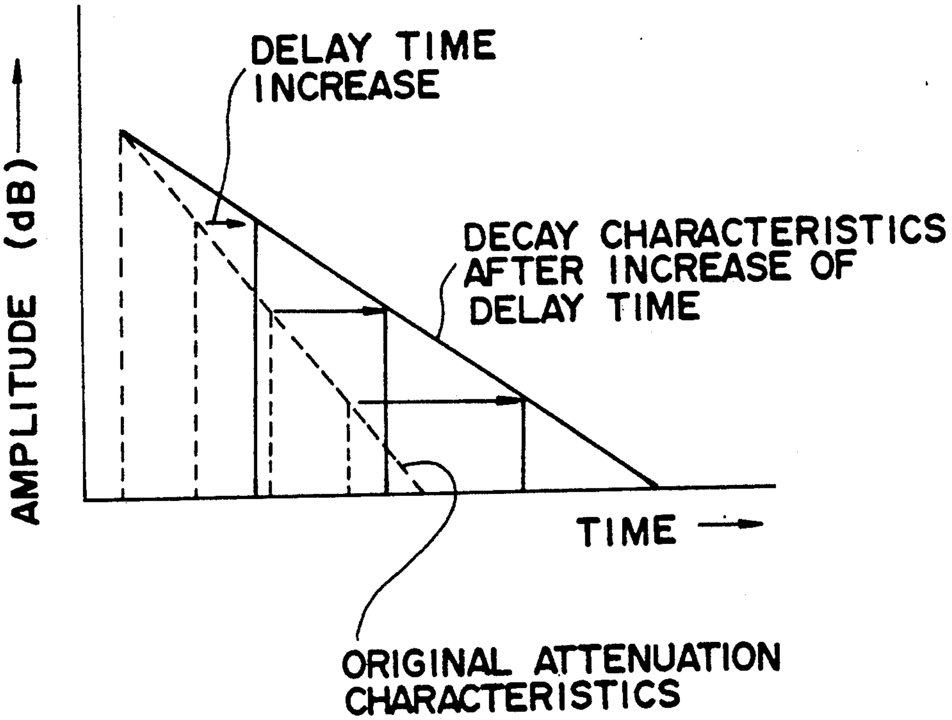
FIG. 7 is a diagram showing decay characteristics of the embodiment of FIG. 1.
Figure 10:
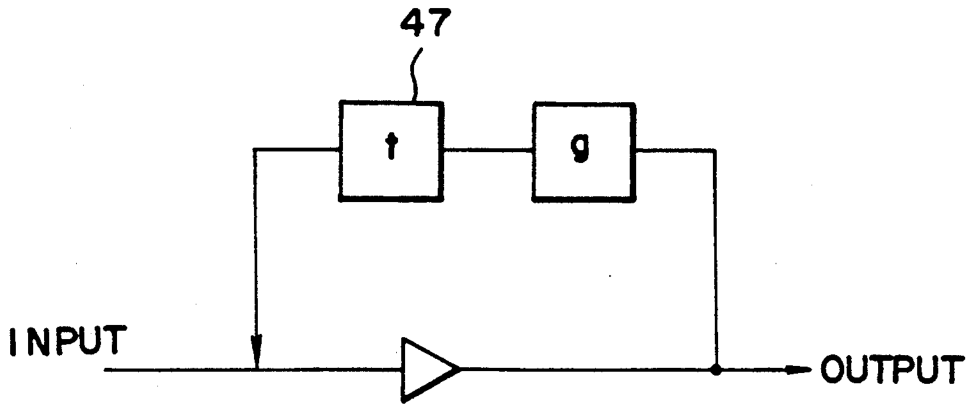
FIG. 10 is a block diagram showing the embodiment of FIG. 2 in a modelled form.
Figure 11:
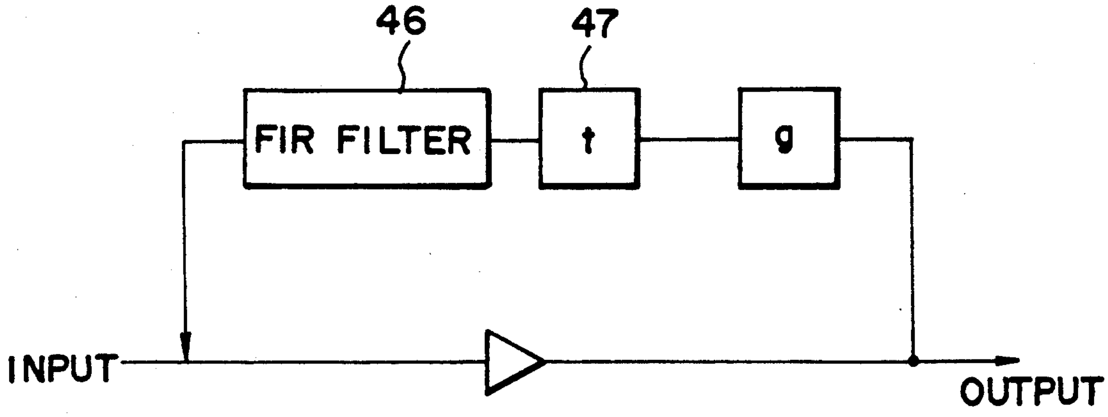
FIG. 11 is a block diagram showing the prior art device of FIG. 1 in a modelled form.

For confirming these effects of the invention, reverberation time was measured with respect to a model constructed as shown in the block diagram of FIG. 10 which is equivalent to the extension of reverberation time by utilizing the loop gain shown in FIG. 2 and a model constructed as shown in the block diagram of FIG. 11 which is equivalent to the extension of reverberation time by utilizing extension of time axis of impulse responses shown in FIG. 1. Delay elements 47 were provided in the circuits of FIGS. 10 and 11 for simulating distance between the microphone 12 and the loudspeaker 14. As the impulse response of the FIR filter 46 of FIG. 11, one shown in FIG. 8 was employed.

The models of FIGS. 10 and 11 were set to a state which was stable to howling (i.e., the loop gain was set at a gain which was 3 dB below the howling point) and pink noise was applied to the models. The following results were obtained:

| | Model of FIG. 10 | Model of FIG. 11 |
|---|---|---|
| Output | 11.2 dB | 20.5 dB |
| $RT_{60}$ | 1.062 sec. | 1.944 sec. |

As will be apparent from these results of measurement of reverberation time, the convolution of impulse responses contributes to amplification of gain to a larger extent for the same loop gain while maintaining a stable state and contributes also to securing a smooth reverberation characteristics as compared with a case where no convolution of impulse response is made.

Figure 12:
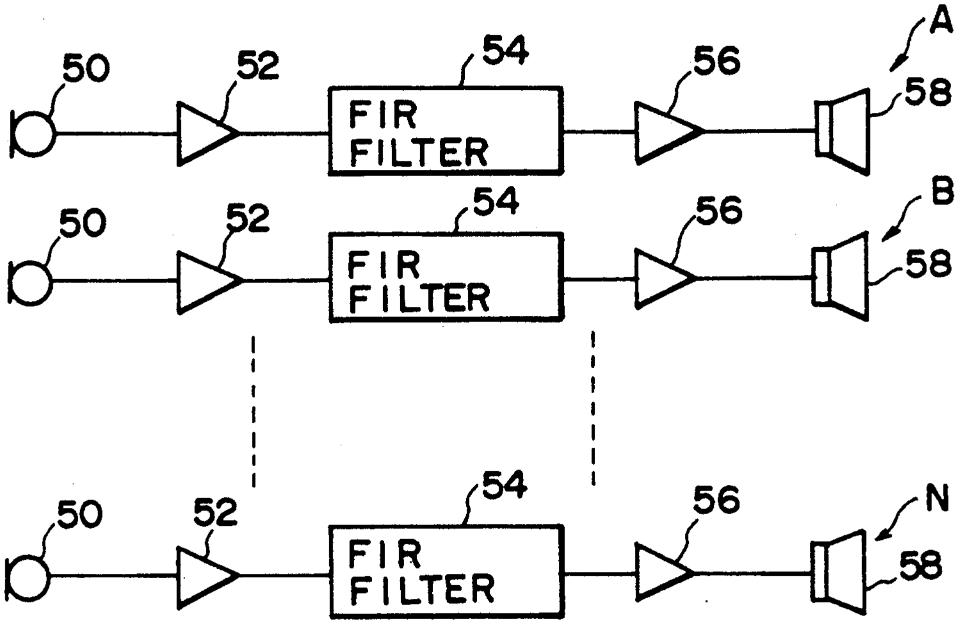
FIGS. 12 and 13 are block diagrams showing respectively other embodiments of the invention.

Another embodiment of the invention is shown in FIG. 12. In this embodiment, for enabling to cope with relatively large acoustic space, the system shown in FIG. 1 is provided in plural channels A through N which are independent from one another.

Locations of a microphone 50 and a loudspeaker 58 in the acoustic space (not shown) differ one from another in these channels A through N. In each of the channels A through N, diffused sound picked up by the microphone 50 is applied to an FIR filter circuit 54 through a preamplifier 52 and subjected to a convolution operation by using impulse responses of finite length stored in the FIR filter circuit 54. The output of the FIR filter circuit 54 is supplied to a loudspeaker 58 through a power amplifier 56. Sounds from the respective loudspeakers 58 are combined together and the combined sound is picked up again by the microphones 50 of the respective channels A through N thereby forming a feedback loop.

According to this embodiment, since the locations of the microphone 50 and the loudspeaker 58 differ one from another in the channels A through N though these channels are of the same construction, delay time due to distance between the microphone 50 and the loudspeaker 58 differs one from another in these channels A through N. Accordingly, the channels A through N can be deemed as independent from on another despite the fact that the same impulse responses are used throughout these channels A through N. It is of course possible to use different impulse responses among the channels A through N.

The control for varying time axis of impulse responses in the FIR filter circuit 54 can be made in association with other channels or individually among these channels A through N.

Figure 13:
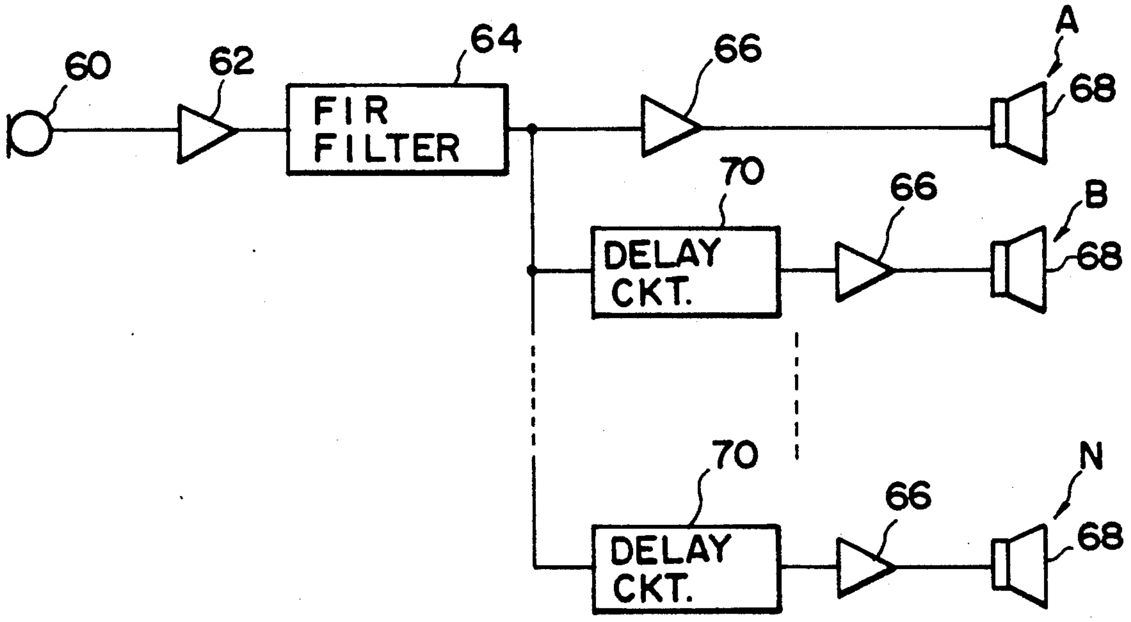

A still another embodiment of the invention is shown in FIG. 13. This embodiment is intended to produce similar effect to the one obtainable from the embodiment shown in FIG. 12 by employing a simplified construction.

In this embodiment, loudspeakers 68 of channels A through N are provided in different locations in the sound system whereas a microphone 60 is used commonly for the respective channels A through N. Diffused sound picked up by the common microphone 60 is applied to an FIR filter circuit 64 through a preamplifier 62 and subjected to a convolution operation by using impulse responses of finite length stored in the FIR filter circuit 64. The output of the FIR filter circuit 64 is branched to the respective channels A through N. In the channel A, the output of the FIR filter circuit 64 is directly supplied to a power amplifier 66 and then to a loudspeaker 68. In other channels B through N, the output of the FIR filter circuit 64 is delayed by a delay circuit 70 and thereafter is supplied to the loudspeaker 68 through the power amplifier 66. Delay time of the delay circuit 70 is set to a value which is different one channel from another. Sounds from the loudspeakers 68 of the respective channels are combined together and then is picked up again by the microphone 60, a feedback loop thereby being formed.

According to this embodiment, the common microphone 60 and the common FIR filter circuit 64 are employed for the channels A through N but, since reflectd sounds provided by the FIR filter circuit 64 are differently extended by the delay circuits 70 of different delay times in the respective channels A through N, the respective channels A through N can be made independent from one another.

We claim:

1. A reverberation imparting device comprising:

a microphone means disposed in an acoustic space for picking up sound in the acoustic space;

loudspeaker means disposed in the acoustic space for diffusing the sound picked up by said microphone means; and feedback means comprising a signal processing circuit for electrically processing an electric signal corresponding to the sound picked up by said microphone means, an output of said signal processing circuit being supplied to said loudspeaker means, said microphone means, feedback means and loudspeaker means forming a feedback loop, and said signal processing circuit in said feedback means comprising means for subjecting a composite impulse response to a convolution operation to provide an output representative of the convolved impulse response to said loudspeaker means and means for increasing all delay times of impulse responses to increase reverberation time and decreasing all delay times of impulse responses to decrease reverberation time.

2. A reverberation imparting device as defined in claim 1 wherein said signal processing circuit comprises an FIR filter which subjects a composite impulse response to a convolution operation and thereby produces a plurality of reflected sound signals for a single input sound.

3. A reverberation imparting device as defined in claim 2 wherein there are provided a plurality of said feedback loops each consisting of said microphone, feedback means and loudspeaker means.

4. A reverberation imparting device as defined in claim 1 wherein a plurality of said loudspeaker means are provided for single said microphone and said signal processing circuit comprises an FIR filter which receives an output signal from said microphone, subjects a composite impulse response to a convolution operation and produces a plurality of reflected sound signals for a single input sound and a plurality of delay circuits to which an output of said FIR filter is applied, outputs of said delay circuits being supplied to said plurality of loudspeaker means.

5. A reverberation imparting device for extending the reverberation time of a sound signal, the reverberation imparting device comprising:

a microphone located in an acoustic space for picking up a sound signal in the acoustic space and converting the sound signal to an electrical signal;

a finite impulse response filter operating on the electrical signal to delay the signal in the time domain and generating an electrical reverberation signal through a finite impulse response convolution operation, the finite impulse response filter being adjustable to increase delay time associated with each impulse response to increase reverberation time and decrease delay time associated with each impulse response to decrease reverberation time; and loudspeaker means for converting the reverberation signal into a sound signal that is directed into the acoustic space.

6. The reverberation imparting device as defined in claim 5 further including a plurality of finite impulse response filters.

7. The reverberation imparting device as defined in claim 6 wherein a separate microphone is provided for each finite impulse response filter.

8. The reverberation imparting device as defined in claim 6 wherein said loudspeaker means comprises a separate loudspeaker for each finite impulse response filter.

9. The reverberation imparting device as defined in claim 7 wherein each of the microphones is located in a different location in the acoustic space.

10. A reverberation imparting device as defined in claim 8 wherein each of the microphones is located in a different location in the acoustic space.

11. A reverberation imparting device as in claim 5 wherein the finite impulse response filter has filter characteristics selected so that it forms a plurality of comb filters having different characteristics thereby to provide desired overall frequency response characteristics for the finite impulse response filter.

* * * * *